US008869422B2

(12) United States Patent
Velazquez et al.

(10) Patent No.: US 8,869,422 B2
(45) Date of Patent: Oct. 28, 2014

(54) METHODS AND APPARATUS FOR MARANGONI SUBSTRATE DRYING USING A VAPOR KNIFE MANIFOLD

(75) Inventors: Edwin Velazquez, Union City, CA (US); Allen L. D'Ambra, Burlingame, CA (US); Jim K. Atkinson, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 244 days.

(21) Appl. No.: 13/458,824

(22) Filed: Apr. 27, 2012

(65) Prior Publication Data

US 2013/0283634 A1    Oct. 31, 2013

(51) Int. Cl.
F26B 7/00       (2006.01)

(52) U.S. Cl.
USPC ........ 34/411; 34/423; 34/78; 34/90; 134/902; 239/455; 15/88.3

(58) Field of Classification Search
USPC ............... 34/411, 413, 423, 69, 78, 80, 90; 134/25.4, 30, 95.2, 902; 118/70; 239/104, 455, 597; 15/21.1, 77, 88.1, 15/88.3
See application file for complete search history.

(56) References Cited

U.S. PATENT DOCUMENTS

| 2,940,418 | A |   | 3/1959  | Penrod et al. |
|-----------|---|---|---------|---------------|
| 4,270,702 | A |   | 6/1981  | Nicholson     |
| 4,515,313 | A | * | 5/1985  | Cavanagh ..................... 239/455 |
| 4,887,545 | A |   | 12/1989 | Soininen      |
| 4,930,705 | A | * | 6/1990  | Broerman .................. 239/590.5 |
| 5,609,305 | A | * | 3/1997  | Webb .......................... 239/590.3 |
| 5,660,642 | A | * | 8/1997  | Britten ............................ 134/30 |
| 5,849,104 | A | * | 12/1998 | Mohindra et al. ........... 134/25.4 |
| 6,328,814 | B1|   | 12/2001 | Fishkin et al. |
| 6,440,215 | B1|   | 8/2002  | Lymn et al.   |
| 6,746,544 | B2|   | 6/2004  | Fishkin et al.|
| 6,955,516 | B2|   | 10/2005 | Achkire et al.|
| 7,198,055 | B2|   | 4/2007  | Woods et al.  |
| 7,252,098 | B2|   | 8/2007  | Fishkin et al.|
| 7,461,797 | B2|   | 12/2008 | Bhat          |
| 7,513,062 | B2|   | 4/2009  | Achkire et al.|
| 7,718,011 | B2|   | 5/2010  | Fishkin et al.|
| 7,980,255 | B2|   | 7/2011  | Achkire et al.|
| 8,322,045 | B2|   | 12/2012 | Stein et al.  |
| 2004/0031167 | A1 | | 2/2004 | Stein et al. |
| 2004/0200409 | A1 | | 10/2004| Svirchevski  |

(Continued)

FOREIGN PATENT DOCUMENTS

WO     WO 2013/162910     * 10/2013     ............ H01L 21/302

OTHER PUBLICATIONS

International Search Report and Written Opinion of International Application No. PCT/US2013/036247 mailed Jul. 26, 2013.

*Primary Examiner* — Steve M Gravini
(74) *Attorney, Agent, or Firm* — Dugan & Dugan, PC

(57) ABSTRACT

The present invention provides methods and apparatus for a Marangoni vapor knife assembly. The assembly includes a base having a channel extending longitudinally through the base and a plurality of passages extending laterally from the channel toward an outer face of the base; a top plate adapted to be removeably coupled to the base with an outer face flush with the outer face of the base; and a shim adapted to be disposed between the base and the top plate and further adapted to form a plurality of spray orifices in the assembly. Numerous additional features are disclosed.

20 Claims, 13 Drawing Sheets

(56) References Cited

U.S. PATENT DOCUMENTS

| | | |
|---|---|---|
| 2005/0241684 A1 | 11/2005 | Achkire et al. |
| 2006/0174921 A1 | 8/2006 | Achkire et al. |
| 2006/0260653 A1 | 11/2006 | Fishkin et al. |
| 2009/0032068 A1 | 2/2009 | Stein et al. |
| 2009/0078292 A1 | 3/2009 | Stein et al. |
| 2009/0241996 A1 | 10/2009 | Achkire et al. |
| 2010/0006124 A1 | 1/2010 | Achkire et al. |
| 2010/0325913 A1 | 12/2010 | Wang et al. |
| 2013/0283634 A1* | 10/2013 | Velazquez et al. .............. 34/443 |

* cited by examiner

METHODS AND APPARATUS FOR MARANGONI SUBSTRATE DRYING USING A VAPOR KNIFE MANIFOLD

FIELD OF THE INVENTION

The present invention generally relates to vapor knives, and more particularly is directed to methods and apparatus for Marangoni substrate drying using a vapor knife manifold.

BACKGROUND OF THE INVENTION

Existing isopentyl acetate (IPA) vapor spray bars used to dry semiconductor substrates using the Marangoni effect are subject to clogging. A clogged vapor spray bar results in streaking on the substrate and thus, the knife becomes unusable. Typically, such vapor spray bars are formed using a tube with a line of very small spray orifices arranged along the length of the tube. The small-sized spray orifices are desirable to reduce the amount of IPA vapor that is used in drying but make the vapor spray bar more prone to becoming clogged. The tube is welded to the IPA supply channel during manufacturing and once welded, the tube becomes unserviceable. Thus, if an orifice becomes clogged, the vapor spray bar is typically disposed and replaced with a new vapor spray bar. Therefore, what is needed are methods and apparatus that enable a vapor knife suitable for use in Marangoni drying to be repaired and/or cleaned.

SUMMARY OF THE INVENTION

Inventive methods and apparatus are provided for a Marangoni vapor knife assembly. In some embodiments, the assembly includes a base having a channel extending longitudinally through the base and a plurality of passages extending laterally from the channel toward an outer face of the base; a top plate adapted to be removeably coupled to the base with an outer face flush with the outer face of the base; and a shim adapted to be disposed between the base and the top plate and further adapted to form a plurality of spray orifices in the assembly.

In some other embodiments, the present invention provides a Marangoni vapor knife manifold. The manifold includes a first Marangoni vapor knife assembly; and a second Marangoni vapor knife assembly. The first and second Marangoni vapor knife assemblies are both coupled to vapor supplies. In some embodiments, the vapor supplies may be the same supply. Spray orifices of the assemblies are adapted to be aimed at a substrate passed between the assemblies. The Marangoni vapor knife assemblies each include: a base having a channel extending longitudinally through the base and a plurality of passages extending laterally from the channel toward an outer face of the base; a top plate adapted to be removeably coupled to the base with an outer face flush with the outer face of the base; and a shim adapted to be disposed between the base and the top plate and further adapted to form the spray orifices in each assembly.

In yet other embodiments, the present invention provides methods of Marangoni drying a substrate. The methods include providing a Marangoni vapor knife manifold including a first Marangoni vapor knife assembly and a second Marangoni vapor knife assembly, wherein the first and second Marangoni vapor knife assemblies are both coupled to a common vapor supply, wherein spray orifices of the assemblies are adapted to be aimed at a substrate passed between the assemblies, and wherein the Marangoni vapor knife assemblies each include: a base having a channel extending longitudinally through the base and a plurality of passages extending laterally from the channel toward an outer face of the base; a top plate adapted to be removeably coupled to the base with an outer face flush with the outer face of the base; and a shim adapted to be disposed between the base and the top plate and further adapted to form the spray orifices in each assembly; removing a substrate from a rinse pool between the first and second Marangoni vapor knife assemblies; and directing a vapor flow from the spray orifices at menisci formed along a width of the substrate at an air/fluid interface on both sides of the substrate.

Numerous other aspects are provided. Other features and aspects of the present invention will become more fully apparent from the following detailed description, the appended claims and the accompanying drawings.

DETAILED DESCRIPTION

General purpose air knives which are used to create a sheet of air for applications such as smoothing a coating, blowing away debris, or blasting away liquids to dry a surface, are not suitable for use in Marangoni drying of semiconductor substrates. Such air knives are typically designed to discharge a high volume of high-speed air. In drying applications, this results in drying the liquid on the surface (e.g., leaving a residue behind) instead of using the surface tension of the liquid to pull the liquid off the surface while gently pushing the liquid to reinforce the surface tension force as in Marangoni drying. In addition, the use of high volumes of air are not desirable in semiconductor substrate drying because chemicals, such as isopentyl acetate (IPA), are used to enhance the Marangoni drying effect and using high volumes would result in significant waste and extra expense. Furthermore, using high-speed air would result in splashing of the rinse pool and fluid splatter would likely land back onto the semiconductor substrate as it is removed from the rinse pool. Therefore, vapor knives suitable for Marangoni drying are specifically adapted for low volume flow at lower speeds to provide a gentle force on the fluid/air interface to compress the meniscus formed as the substrate is withdrawn from the rinse pool. To achieve the desired vapor flow rate and volume, conventional Marangoni vapor knives use very small, fixed-size spray orifices which unfortunately are subject to clogging. The construction of such conventional vapor knives makes them unserviceable so that they cannot be cleaned when a clog occurs.

The present invention provides improved methods and apparatus for a vapor knife assembly with very small, fixed size, spray orifices suitable for use in Marangoni drying of substrates, which can be disassembled and serviced if a clog occurs. The vapor knife assembly of the present invention includes a base, a shim, and a top plate. The shim, which includes a series of small notches, is used to create small gaps between the base and the top plate which serve as the spray orifices. The three pieces are held together with fasteners but can be disassembled for cleaning and/or replacement of the shim if a clog occurs.

In some embodiments, two vapor knife assemblies can be used together to form a vapor knife manifold that can be used to Marangoni dry both sides of a semiconductor substrate concurrently as the substrate is lifted from a rinse pool. The vapor knife assemblies include spray orifices disposed to direct an IPA vapor flow at the air/liquid interface on either side of the substrate. Other chemicals may be used. The base and top plate are flush with each other at the gaps formed by the notches in the shim so that the spray orifices can release the vapor without the vapor being impeded or deflected from flowing to the meniscus target.

Figure 1:
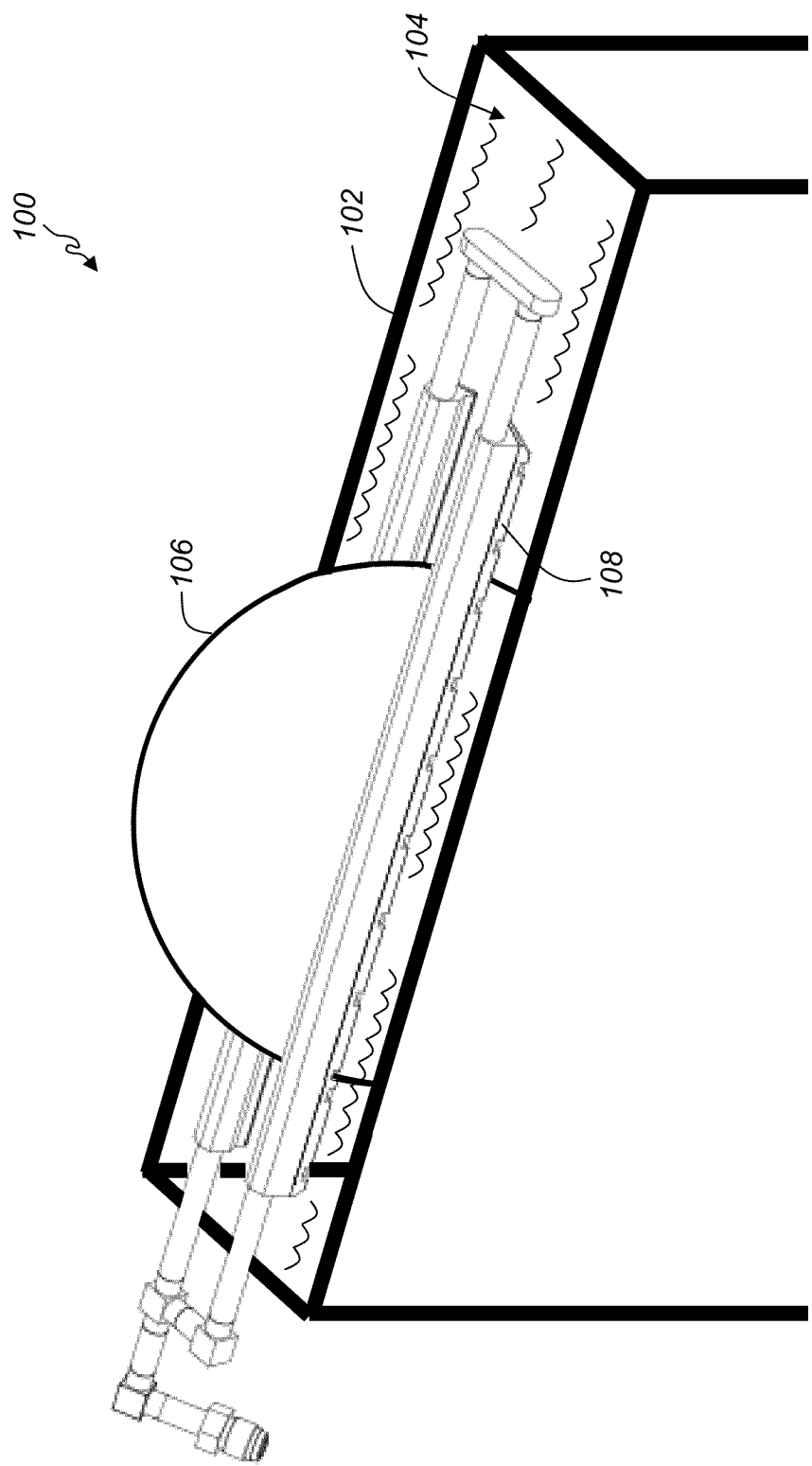
FIG. 1 is a diagram depicting a perspective view of an example Marangoni substrate drying system according to some embodiments of the present invention.
Figure 2:
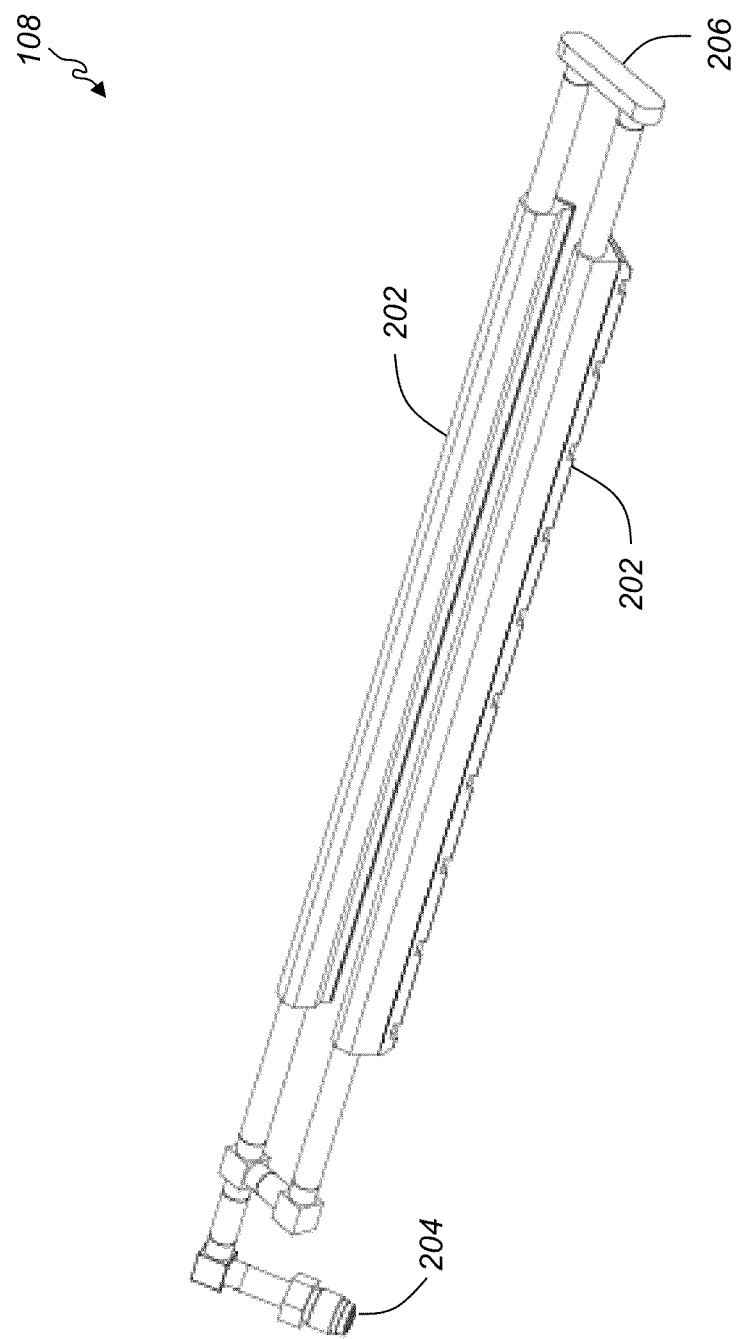
FIG. 2 is a diagram depicting a perspective view of a vapor knife manifold according to some embodiments of the present invention.
Figure 3:
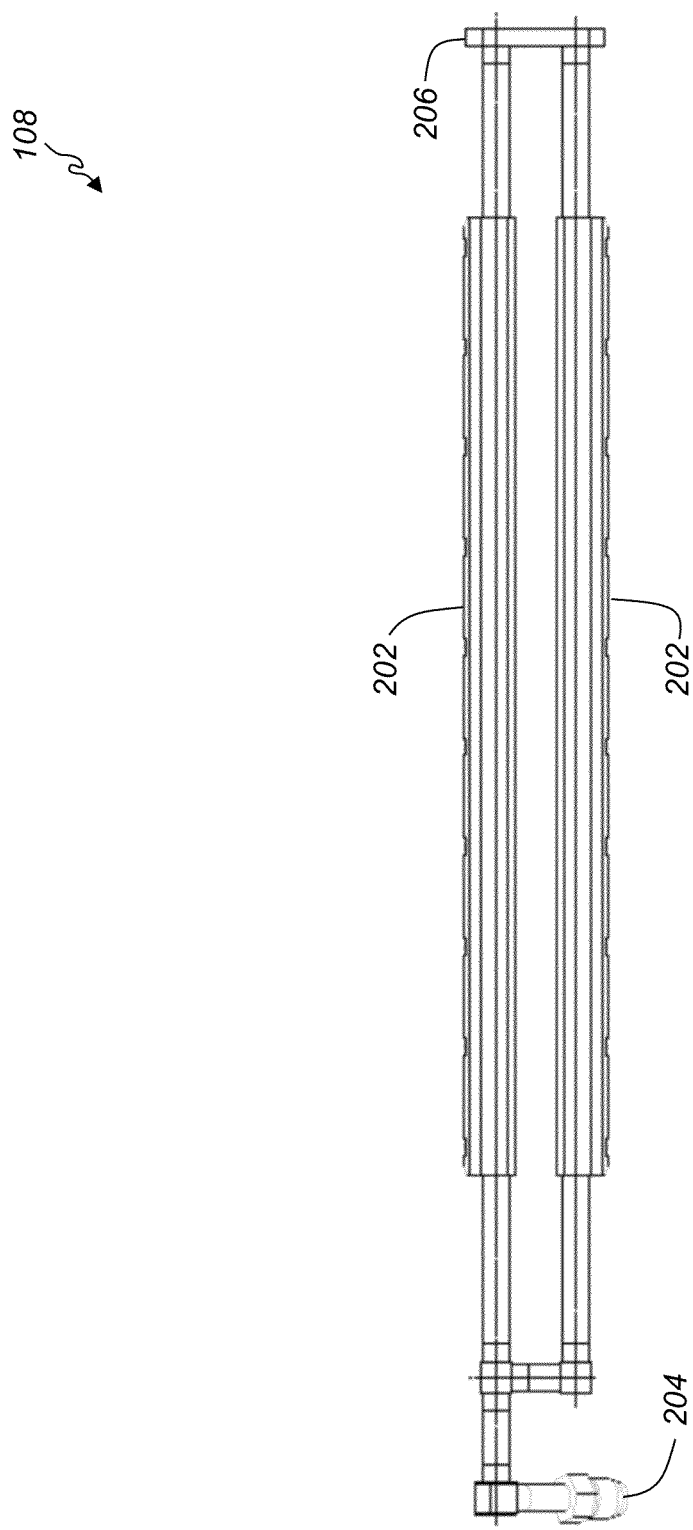
FIG. 3 is a diagram depicting a top view of a vapor knife manifold according to some embodiments of the present invention.

Turning to FIG. 1, a perspective view of a Marangoni substrate drying system 100 is shown. The system 100 includes a rinse tank 102 filled with rinse fluid 104 (e.g., deionized (DI) water) and a robot (not shown) adapted to lift the substrate 106 out of the rinse fluid 104 and through a vapor knife manifold 108. FIG. 2 is a perspective view of the vapor knife manifold 108 and FIG. 3 is a top view. The vapor knife manifold 108 according to the present invention includes two vapor knife assemblies 202 disposed to spray low volume, laminar flow of IPA vapor (or other chemicals) at both sides of a substrate 106 passed between the assemblies 202. The assemblies 202 are coupled together in fluid communication with vapor supply fittings 204 at one end and closed with a cap 206 at the other end. The fittings 204 and cap 206 may be made from stainless steel 316 or 316L but any practicable material may be used.

Figure 4:
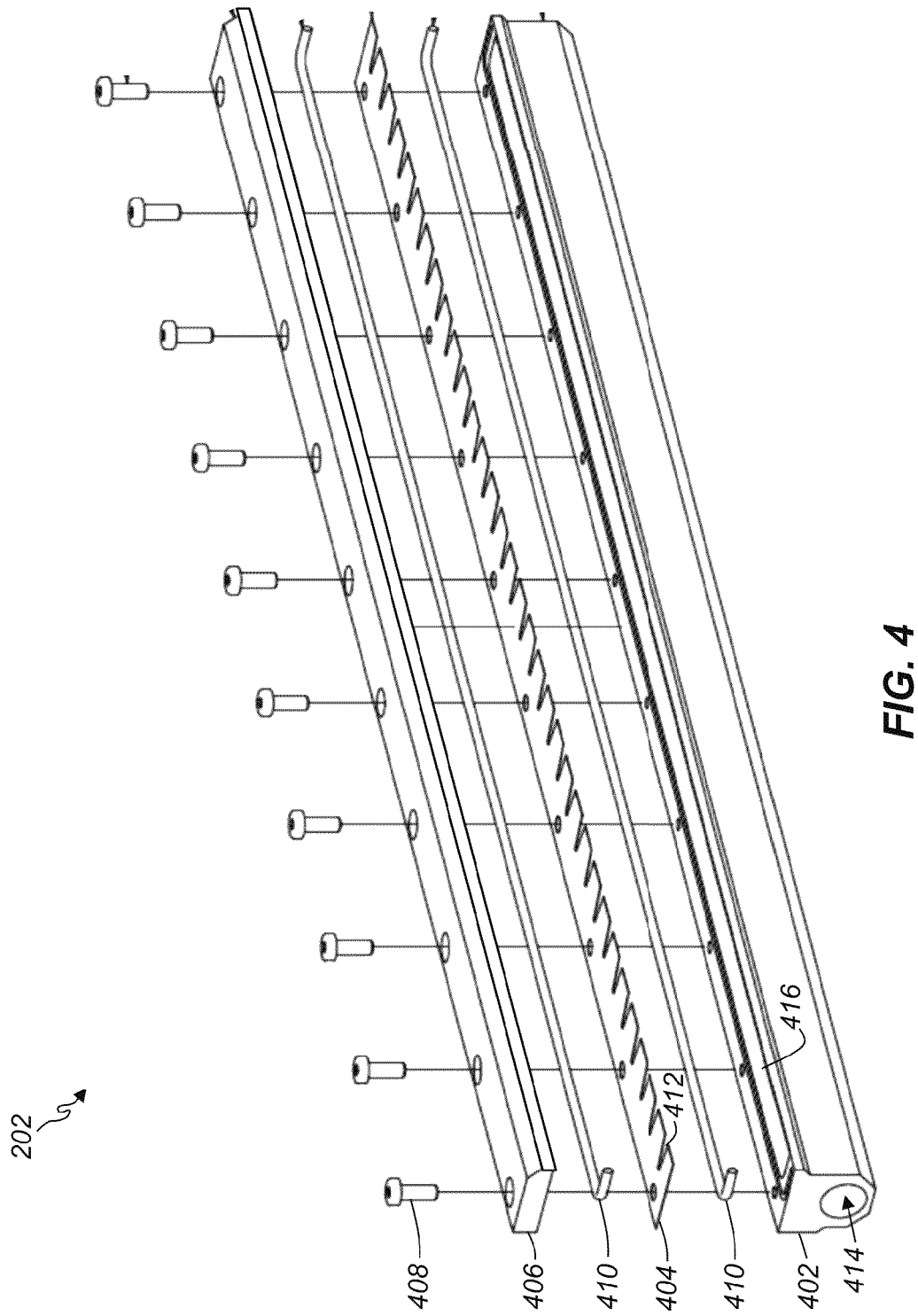
FIG. 4, is a diagram depicting a perspective view of a vapor knife assembly according to some embodiments of the present invention.

Turning now to FIG. 4, an exploded perspective view of a vapor knife assembly 202 is provided. The vapor knife assembly 202 includes a base 402, a shim 404, and a top plate 406 that can be coupled together as indicated in FIG. 4 using fasteners 408 (only one labeled). Compressible sealing material 410 (e.g., an elastic bead) may be used between the base 402 and shim 404 and between the top plate 406 and shim 404 to insure that vapor does not leak out of the vapor knife assembly 202. In some embodiments, the base 402, shim 404, top plate 406 may be made of stainless steel. Other practicable materials may be used.

The shim 404 includes a series of notches 412 (only one labeled) that are disposed to allow vapor in the base 402 to exit the vapor knife assembly 202. In other words, the notches 412 in the shim 404 provide openings between the base 402 and the top plate 406 which function as spray orifices. As will be described in more detail below, the outer faces of the base 402 and the top plate 406 where the vapor exits, are flush and even with each other so that vapor flowing out of the spray orifices is not directed or deflected by the base 402 more or less than the top plate 406. A channel 414 coupled to the vapor supply, runs the length of the base 402 to distribute vapor to each of the notches 412. The notches 412 are in fluid communication with the channel 414 via passages 416. Thus, the vapor knife assembly 202 is adapted to allow vapor entering the vapor knife assembly 202 at the channel 414 to flow out of the vapor knife assembly 202 via the notches 412.

In some embodiments, the shim 404 is approximately 0.0001 in. to approximately 0.120 in. thick to create the desired size (e.g., lateral dimension) for the spray orifices. In addition, the notches 412 are approximately 0.001 in. to approximately 1.0 in. wide (at the widest point) to create the desired size (e.g., vertical dimension) for the spray orifices. These dimensions and spray orifice shape allows the vapor to flow at a volume and rate suitable for Marangoni drying of semiconductor substrates. More specifically, the arrangement and dimensions described above allow the spray orifices to be aimed directly at the meniscus formed at the liquid line as a substrate 106 is removed from a rinse pool 102. Further, this arrangement and dimensions result in a vapor flow that applies the desired pressure on the meniscus to compress the meniscus and to create a surface tension gradient to achieve Marangoni drying of the substrate.

Figure 5:
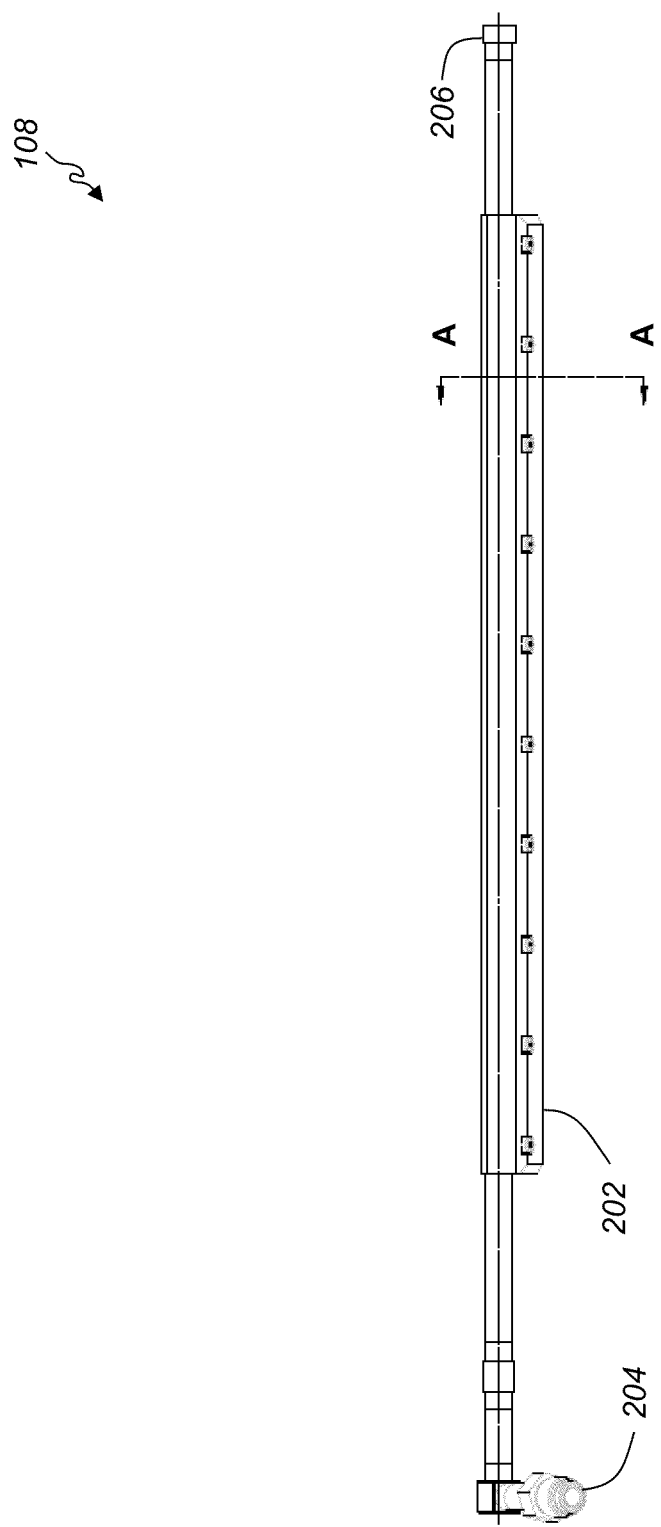
FIG. 5 is a diagram depicting a side view of a vapor knife manifold according to some embodiments of the present invention.
Figure 6:
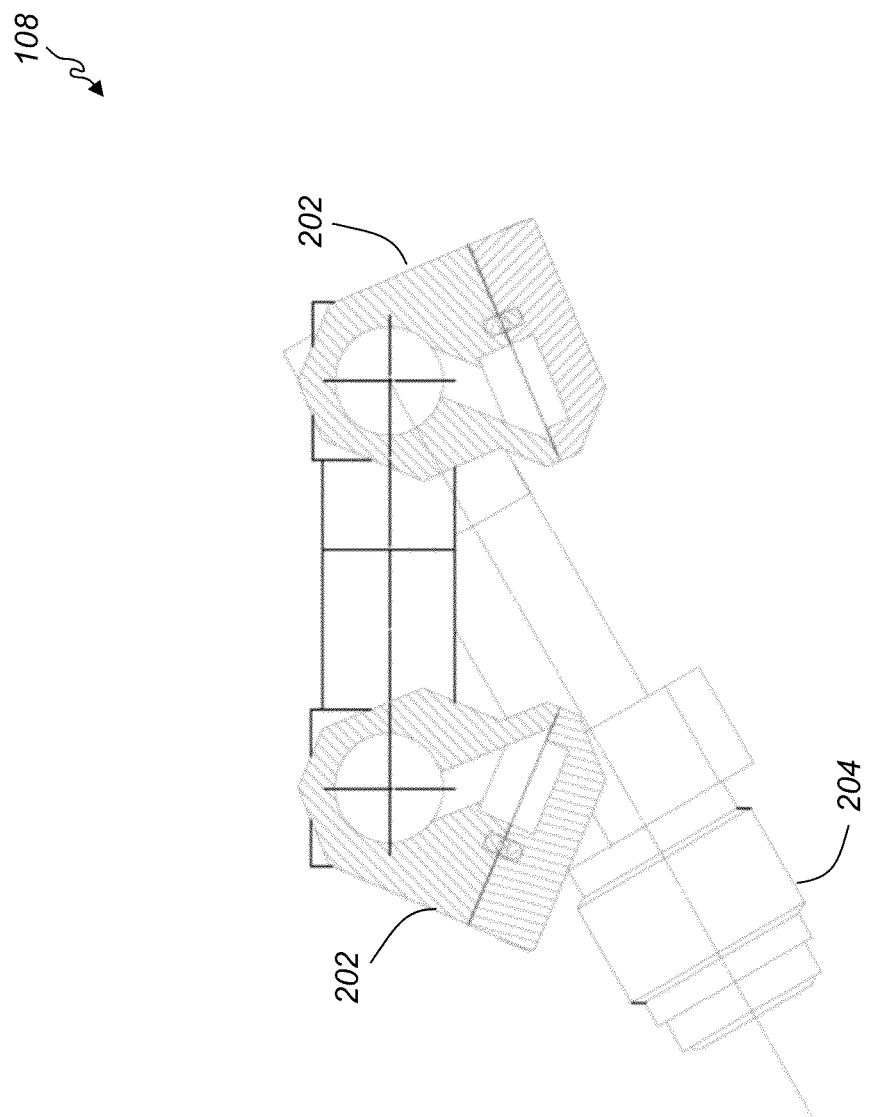
FIG. 6 is a diagram depicting a magnified cross-sectional view of the vapor knife manifold of FIG. 5, taken at cut line A-A, according to some embodiments of the present invention.

Turning now to FIGS. 5 and 6, additional views of an example vapor knife manifold 108 according to the present invention are provided. FIG. 6 is a magnified cross-sectional view of the vapor knife manifold 108 taken at cut line A-A in FIG. 5. FIG. 6 illustrates the relative position and orientation of the vapor knife assemblies 202 in the vapor knife manifold 108 which, along with the above-described features of the present invention, facilitate the Marangoni drying of two sides of a substrate concurrently.

Figure 7:
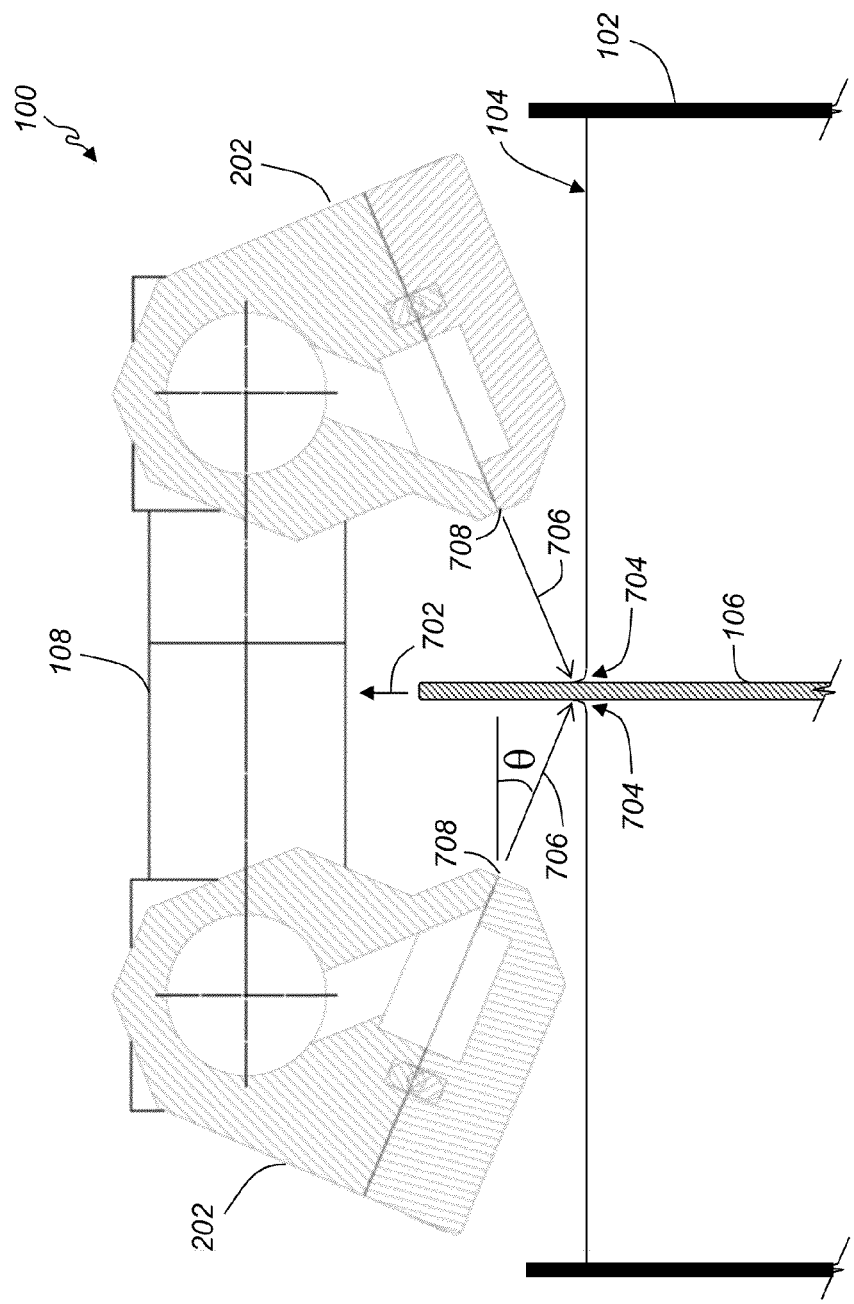
FIG. 7 is a diagram depicting a magnified cross-sectional view of the vapor knife manifold in the system of FIG. 1 according to some embodiments of the present invention.

FIG. 7 provides a similar cross-sectional view as FIG. 6 but with the relative position of the substrate 106 and rinse liquid 104 in the rinse pool 102 represented. As the substrate 106 is lifted out of the rinse fluid 104 in the direction of arrow 702, a meniscus 704 is formed on either side of the substrate 106 at the interface of the rinse fluid 104 and the air along the width of the substrate 106. As indicated by the arrows 706 extending from the spray orifices 708 of the vapor knife assemblies 202 to the menisci 704, the spray orifices 708 are aimed directly at the interface of the rinse fluid 104 and the air along the width of the substrate 106. As seen in FIG. 7, the vapor knife assemblies 202 are oriented and positioned so that the spray orifices 708 can be aimed to flow vapor at the specified area. In some embodiments, the angle θ between the arrows 706 and a horizontal reference line (e.g., a line substantially perpendicular to the major surfaces of the substrate 106 may be approximately 5 degrees to approximately 85 degrees. In some embodiments, angle θ may be in the range of approximately 15 degrees to approximately 30 degrees. In other embodiments, other practicable angles may be used.

Figure 8:
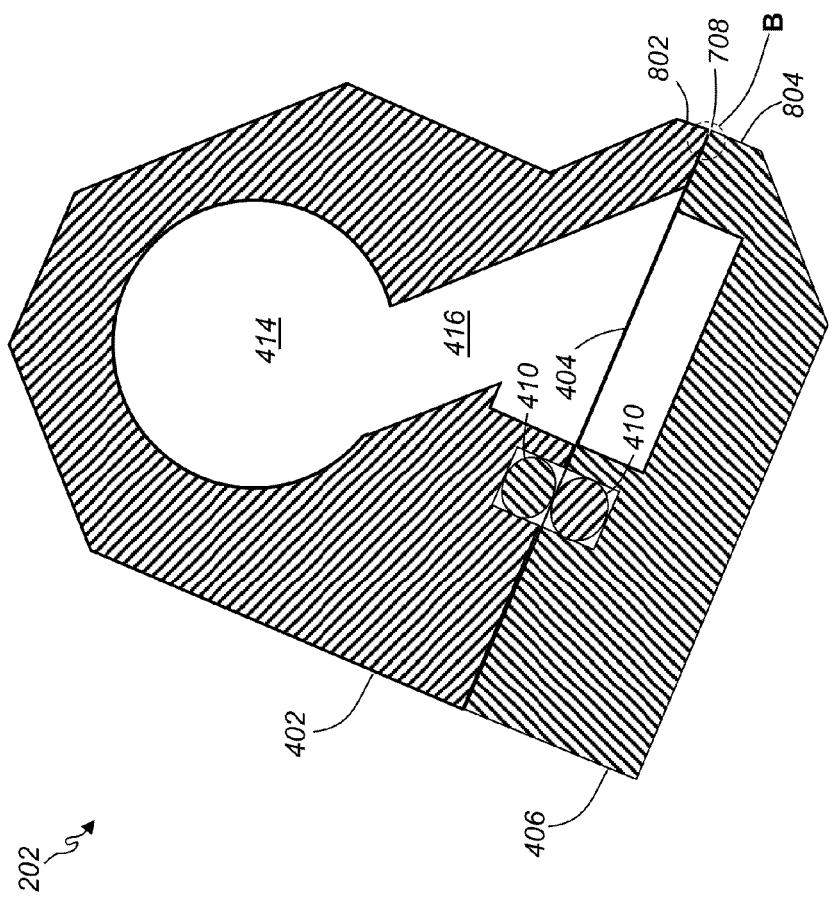
FIG. 8 is a diagram depicting a magnified cross-sectional side view of a vapor knife assembly according to some embodiments of the present invention.

Turning to FIG. 8, a magnified cross-sectional side view of a vapor knife assembly 202 is provided. As indicated above with respect to FIG. 4, the vapor knife assembly 202 includes a base 402, a shim 404, and a top plate 406 that can be coupled together as shown. Compressible sealing material 410 (e.g., an elastic bead) may be used in grooves between the base 402 and shim 404 and between the top plate 406 and shim 404 to insure that vapor does not leak out of the vapor knife assembly 202. In some embodiments, the base 402, shim 404, top plate 406 may be made of stainless steel. Other practicable materials may be used.

As shown in FIG. 4, the shim 404 includes a series of notches 412 (not visible in FIG. 8 but see FIG. 4) that are disposed to allow vapor in the base 402 to exit the vapor knife assembly 202. In other words, the notches 412 in the shim 404 provide openings between the base 402 and the top plate 406 which function as spray orifices 708. The outer face 802 of the base 402 and the outer face 804 of the top plate 406 where the vapor exits, are flush and even with each other so that vapor flowing out of the spray orifices 708 is not directed or deflected by the base 402 more or less than the top plate 406. A channel 414 coupled to the vapor supply, runs the length of the base 402 to distribute vapor to each of the notches 412. The notches 412 are in fluid communication with the channel 414 via passages 416. Thus, the vapor knife assembly 202 is adapted to allow vapor entering the vapor knife assembly 202 at the channel 414 to flow out of the spray orifices 708 of the vapor knife assembly 202 via the passages 416 and the notches 412.

Figure 9:
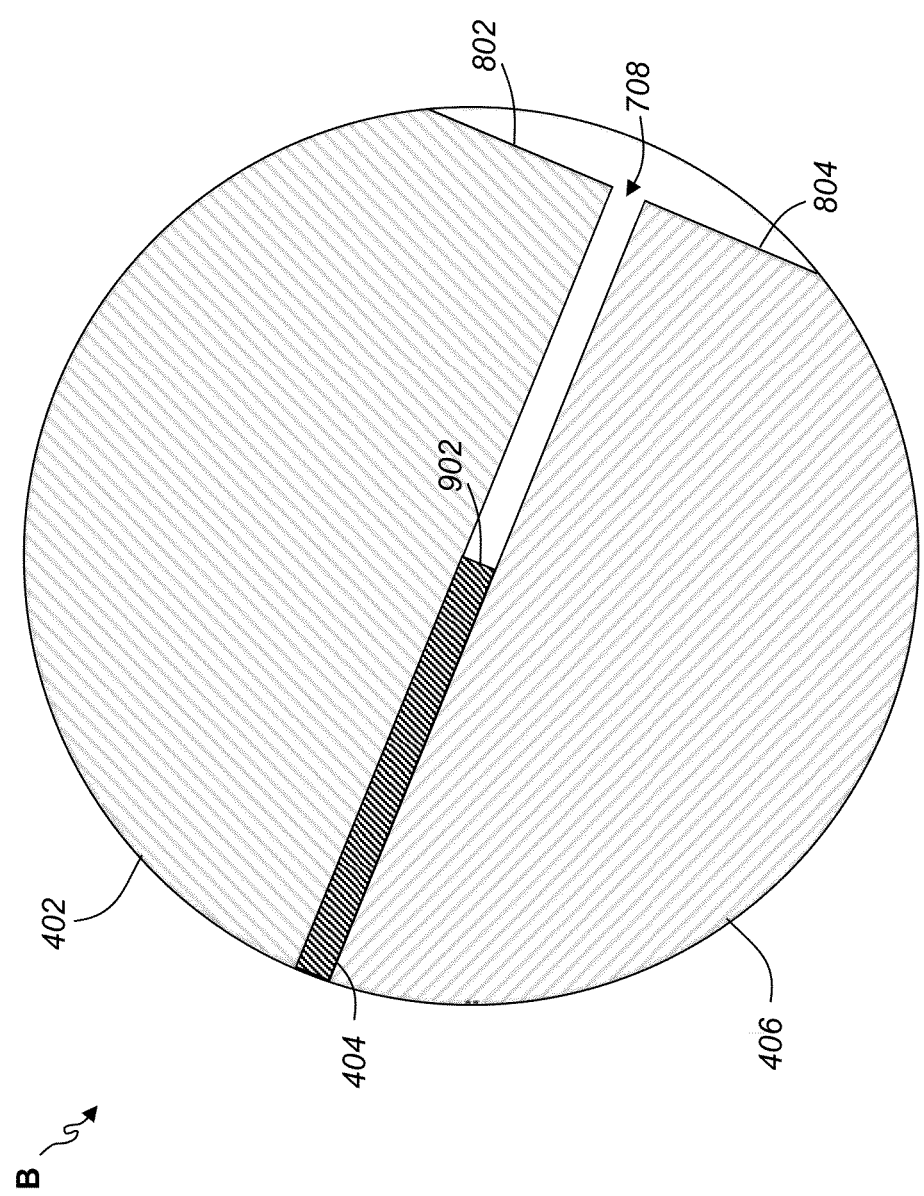
FIG. 9 is a diagram depicting a magnified view of the area labeled "B" in FIG. 8.

FIG. 9 is a magnified view of the area labeled "B" in FIG. 8. In this view, the relative position of the outer face 802 of the base 402 and the outer face 804 of the top plate 406 can be clearly seen to be flush with each other. In addition, a spray orifice 708 is more clearly depicted. Note that the outer edge 902 of the shim 404 is recessed back into the vapor knife assembly 202 relative to the outer faces 802, 804 of the base 402 and the top plate 406.

Figure 10:
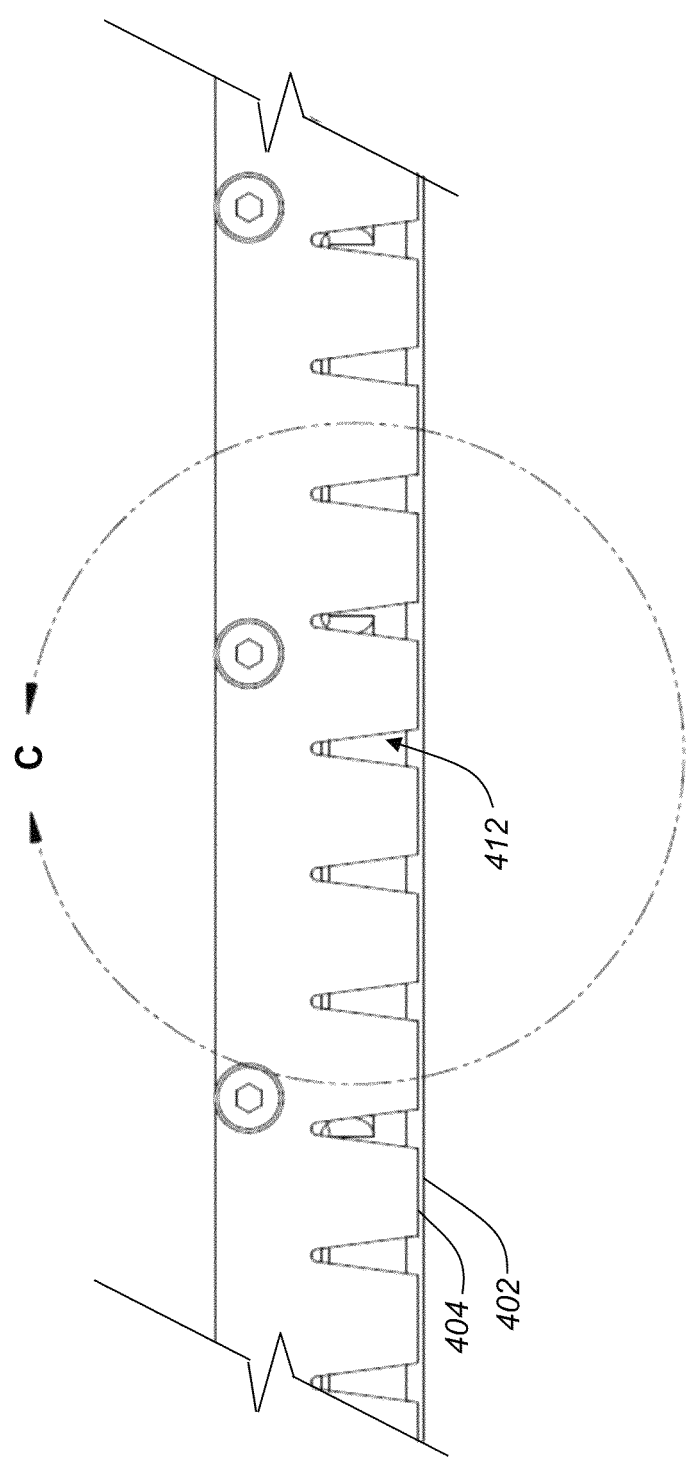
FIG. 10 is a diagram depicting a top view of a portion of a shim over-laid on a base without a top plate according to some embodiments of the present invention.
Figure 11:
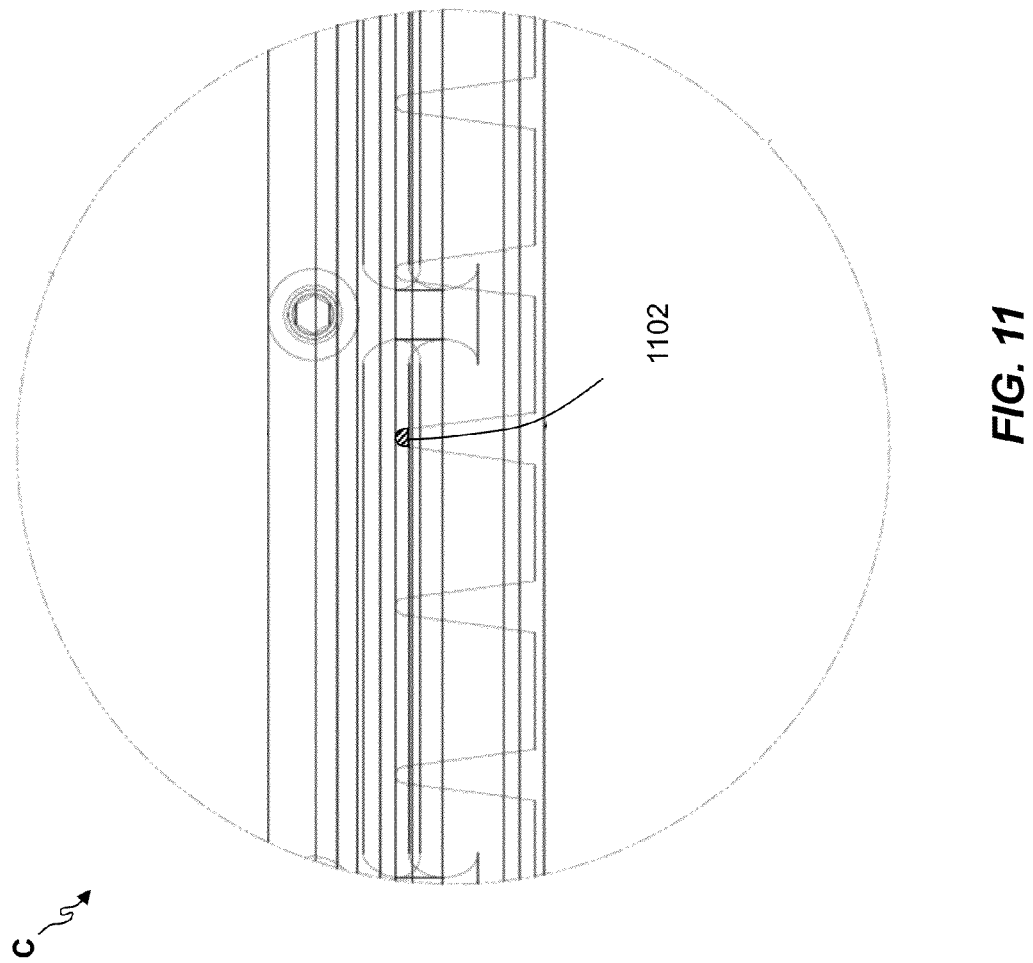
FIG. 11 is a diagram depicting a magnified view of the area labeled "C" in FIG. 10.

Turning now to FIGS. 10 and 11, a top view of a portion of the shim 404 over-laid on the base 402 without the top plate 406 is provided. FIG. 11 is a magnified view of the area labeled "C" in FIG. 10 with hidden lines visible through the shim 404. These drawings illustrate the very small opening 1102 formed at the apex of each notch 412 to the respective passage 416 from the channel 414 of the base 402.

Figure 12B:
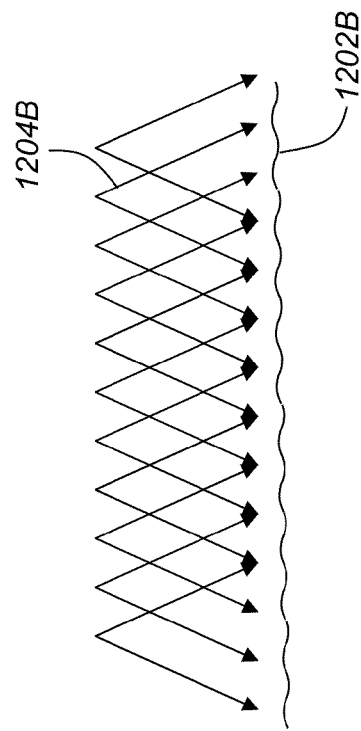
FIG. 12B is a diagram depicting the spray pattern and wave front shape of a vapor sheet generated by a Marangoni vapor knife according to embodiments of the present invention.
Figure 12A:
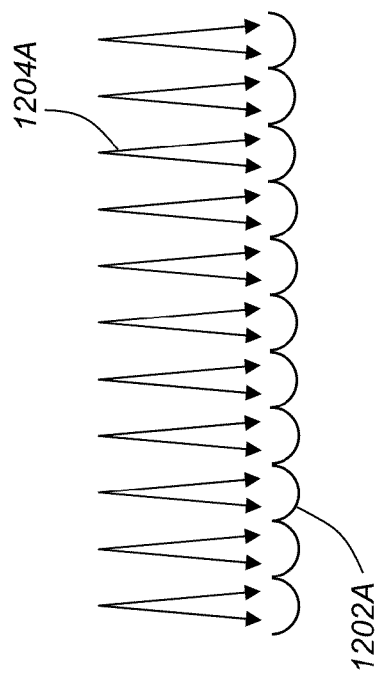
FIG. 12A is a diagram depicting the spray pattern and wave front shape of a vapor sheet generated by a conventional prior art spray bar.

FIGS. 12A and 12B illustrate the differences between the spray pattern and wave front shape of a prior art spray bar and the vapor knife assembly 202 of the present invention. FIG. 12A depicts a vapor sheet wave front shape 1202A that includes relatively sharp and large peeks and valleys. This shape 1202A is a result of the shape of the round spray orifices of a convention spray bar that has a relatively narrow, non-overlapping spray pattern 1204A as indicated by the arrows. In contrast, FIG. 12B depicts a vapor sheet wave front shape 1202B that includes relatively smooth and small peeks and valleys. This shape 1202B is a result of the shape of the spray orifices of the Marangoni vapor knife assembly 202 that has a relatively wide, overlapping spray pattern 1204B as indicated by the arrows. The flatter, smoother wave front shape 1202B is desirable over the prior art wave front shape 1202A because a more consistent and uniform force is applied to the meniscus by the flatter, smoother wave front shape 1202B.

Figure 13:
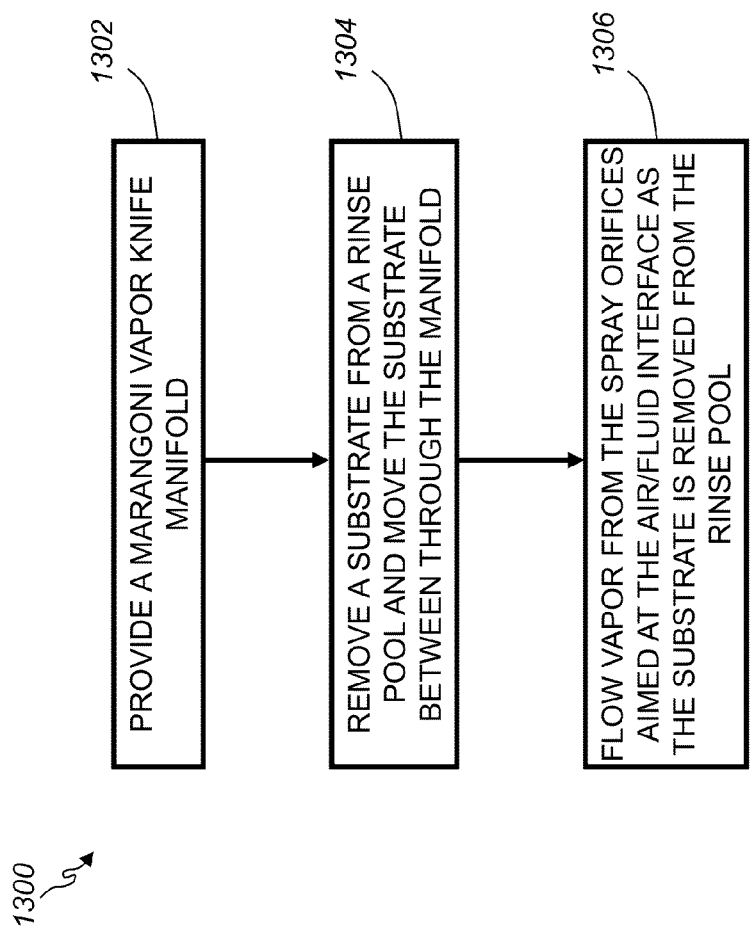
FIG. 13 is flowchart depicting an example method of Marangoni substrate drying according to some embodiments of the present invention.

Turning now to FIG. 13, a flow chart depicting an example method 1300 of Marangoni drying a substrate using the above-described apparatus is provided. In Step 1302, a Marangoni vapor knife manifold is provided. The manifold includes two Marangoni vapor knife assemblies coupled to a common vapor (e.g., IPA vapor) supply. In some embodiments, separate supplies may be used. The spray orifices of the assemblies are arranged so that they are both aimed at a substrate passed between the assemblies. Each Marangoni vapor knife assembly includes a base, a top plate, and a shim. The base includes a channel that extends longitudinally through the length of the base. A plurality of passages extends laterally from the channel toward an outer face of the base. The top plate is adapted to be removeably coupled to the base. The top plate includes an outer face that is flush with the outer face of the base when the base and top plate are coupled together. The shim is adapted to be disposed between the base and the top plate. The shim includes notches that form the spray orifices in each assembly.

In Step 1304, a substrate is removed from a rinse pool and concurrently moved between the two Marangoni vapor knife assemblies. In Step 1306, a vapor flow (e.g., a sheet of IPA vapor) is discharged from the spray orifices. The vapor flow is aimed at menisci formed along the width of the substrate at the air/fluid interface on both sides of the substrate. In some embodiments, providing a Marangoni vapor knife manifold includes providing Marangoni vapor knife assemblies with shims that have a plurality of V-shaped notches disposed along an outer edge of the shims. In some embodiments, the notches are each disposed to create an opening to the passages of the base. In some embodiments, each of the notches, the base, and the top plate together form the plurality of spray orifices in the assemblies. In some embodiments, the method 1300 further includes disassembling and cleaning the assemblies when a spray orifice becomes clogged. In some embodiments, directing a vapor flow from the spray orifices includes flowing vapor through the channel in fluid communication with the spray orifices and forming a sheet of vapor with the spray orifice.

Accordingly, while the present invention has been disclosed in connection with the preferred embodiments thereof, it should be understood that other embodiments may fall within the spirit and scope of the invention, as defined by the following claims.

The invention claimed is:

1. A Marangoni vapor knife assembly comprising:
a base having a channel extending longitudinally through the base and a plurality of passages extending laterally from the channel toward an outer face of the base;
a top plate removeably coupled to the base with an outer face flush with the outer face of the base; and
a shim disposed between the base and the top plate that forms a plurality of spray orifices in the assembly.

2. The assembly of claim 1 wherein the shim includes a plurality of notches disposed along an outer edge of the shim.

3. The assembly of claim 2 wherein the notches are each disposed to create an opening to the passages of the base.

4. The assembly of claim 2 wherein each of the notches, the base, and the top plate together form the plurality of spray orifices in the assembly.

5. The assembly of claim 1 wherein the base, top plate, and shim are coupled together via removable fasteners.

6. A Marangoni vapor knife assembly comprising:
a base having a channel extending longitudinally through the base and a plurality of passages extending laterally from the channel toward an outer face of the base;
a top plate adapted to be removeably coupled to the base with an outer face flush with the outer face of the base; and
a shim adapted to be disposed between the base and the top plate and further adapted to form a plurality of spray orifices in the assembly;

wherein the channel is in fluid communication with the spray orifices and the assembly is adapted to direct a sheet of vapor formed by the spray orifices at a meniscus on a substrate being removed from a rinse pool.

7. A Marangoni vapor knife assembly comprising:
a base having a channel extending longitudinally through the base and a plurality of passages extending laterally from the channel toward an outer face of the base;
a top plate adapted to be removeably coupled to the base with an outer face flush with the outer face of the base; and
a shim adapted to be disposed between the base and the top plate and further adapted to form a plurality of spray orifices in the assembly;
wherein the channel is in fluid communication with the spray orifices and the assembly is adapted to Marangoni dry a substrate passed by the assembly.

8. A Marangoni vapor knife manifold comprising:
a first Marangoni vapor knife assembly; and
a second Marangoni vapor knife assembly,
wherein the first and second Marangoni vapor knife assemblies are coupled to one or more vapor supplies,
wherein spray orifices of the assemblies are adapted to be aimed at a substrate passed between the assemblies, and
wherein the Marangoni vapor knife assemblies each include:
a base having a channel extending longitudinally through the base and a plurality of passages extending laterally from the channel toward an outer face of the base;
a top plate adapted to be removeably coupled to the base with an outer face flush with the outer face of the base; and
a shim adapted to be disposed between the base and the top plate and further adapted to form the spray orifices in each assembly.

9. The manifold of claim 8 wherein the shim includes a plurality of notches disposed along an outer edge of the shim.

10. The manifold of claim 9 wherein the notches are each disposed to create an opening to the passages of the base.

11. The manifold of claim 9 wherein each of the notches, the base, and the top plate together form the plurality of spray orifices in the assembly.

12. The manifold of claim 8 wherein the base, top plate, and shim are coupled together via removable fasteners.

13. The manifold of claim 8 wherein the channel is in fluid communication with the spray orifices and the assembly is adapted to direct a sheet of vapor formed by the spray orifices at a meniscus on a substrate being removed from a rinse pool.

14. The manifold of claim 8 wherein the channel is in fluid communication with the spray orifices and the assembly is adapted to Marangoni dry a substrate passed by the assembly.

15. A method of Marangoni drying a substrate, the method comprising:
providing a Marangoni vapor knife manifold including a first Marangoni vapor knife assembly and a second Marangoni vapor knife assembly, wherein the first and second Marangoni vapor knife assemblies are both coupled to a common vapor supply, wherein spray orifices of the assemblies are adapted to be aimed at a substrate passed between the assemblies, and wherein the Marangoni vapor knife assemblies each include: a base having a channel extending longitudinally through the base and a plurality of passages extending laterally from the channel toward an outer face of the base; a top plate adapted to be removeably coupled to the base with an outer face flush with the outer face of the base; and a shim adapted to be disposed between the base and the top plate and further adapted to form the spray orifices in each assembly;
removing a substrate from a rinse pool between the first and second Marangoni vapor knife assemblies; and
directing a vapor flow from the spray orifices at menisci formed along a width of the substrate at an air/fluid interface on both sides of the substrate.

16. The method of claim 15 wherein providing a Marangoni vapor knife manifold includes providing a shim including a plurality of notches disposed along an outer edge of the shim.

17. The method of claim 16 wherein the notches are each disposed to create an opening to the passages of the base.

18. The method of claim 16 wherein each of the notches, the base, and the top plate together form the plurality of spray orifices in the assembly.

19. The method of claim 15 further comprising disassembling and cleaning the first or second assembly when a spray orifice becomes clogged.

20. The method of claim 15 wherein directing a vapor flow from the spray orifices includes flowing vapor through the channel in fluid communication with the spray orifices and forming a sheet of vapor with the spray orifice.

* * * * *